United States Patent [19]

Hager

[11] 3,967,257

[45] June 29, 1976

[54] CURRENT MONITOR CIRCUITS

[75] Inventor: Robert E. Hager, Pittsburgh, Pa.

[73] Assignee: Westinghouse Electric Corporation, Pittsburgh, Pa.

[22] Filed: Jan. 7, 1975

[21] Appl. No.: 539,145

Related U.S. Application Data

[63] Continuation of Ser. No. 322,238, Jan. 9, 1973, abandoned.

[52] U.S. Cl. ............................ 340/253 R; 307/311; 315/135; 340/248 C
[51] Int. Cl.² ..................................... G08B 21/00
[58] Field of Search ............ 340/253 R, 248 C, 250; 324/133; 317/20, 124, DIG. 5; 328/2; 307/311, 317, 318; 250/211 J, 552; 315/83, 122, 135

[56] References Cited
UNITED STATES PATENTS

| | | | |
|---|---|---|---|
| 3,345,536 | 10/1967 | Atkins et al. | 315/83 |
| 3,412,392 | 11/1968 | Jenkins et al. | 340/248 C |
| 3,423,636 | 1/1969 | Rowley, Jr. | 317/20 |
| 3,639,805 | 2/1972 | Muench et al. | 315/122 |
| 3,651,378 | 3/1972 | McWilliams | 340/250 X |
| 3,729,656 | 4/1973 | Luquain | 340/250 |
| 3,767,978 | 10/1973 | Wernli | 317/124 |
| 3,795,821 | 3/1974 | Ichiyanagi | 307/311 X |

OTHER PUBLICATIONS

IBM Technical Disclosure Bulletin, Vol. 14, No. 5, Oct., 1971, p. 1368.

Primary Examiner—John W. Caldwell
Assistant Examiner—Daniel Myer
Attorney, Agent, or Firm—D. C. Abeles

[57] ABSTRACT

A visual indicator in parallel with a zener diode, positioned in series with a load is provided to monitor the presence of current flow in a circuit over a range of several orders of magnitude. In addition, a circuit arrangement is described to monitor the continuity and current flow in two separate parallel paths, feeding a common load in order to check the continuity of the circuitry and associated switching devices. For this purpose, a second current monitor, including a series switch, is placed in parallel with a first series arrangement of a current monitor and a switch. Alternate polarity arrangements of the respective zener diodes associated with the corresponding current monitors are illustrated to show the varing modes of operation contemplated by this invention.

7 Claims, 4 Drawing Figures

[3,967,257]

CURRENT MONITOR CIRCUITS

This is a continuation of application Ser. No. 322,238 filed Jan. 9, 1973, now abandoned.

BACKGROUND OF THE INVENTION

This invention pertains in general to current monitors and more particularly to such circuits that monitor either AC or DC over a wide continuous range of magnitudes.

It is often desirable to monitor the current through a load energized by a source supplying current over a range of several orders of magnitude. Several such circuits have been devised by the prior art for this purpose, such as the circuit arrangements illustrated in the patents to: Brooks, U.S. Pat. No. 3,665,442, issued May 23, 1972; Vinsani et al, U.S. Pat. No. 3,662,369, issued May 9, 1972; A. R. Morris, U.S. Pat. No. 3,505,664, issued Apr. 7, 1970; R. E. Monigal et al, U.S. Pat. No. 3,548,399, issued Dec. 15, 1970; and the patent to E. H. Christian et al, U.S. Pat. No. 3,021,515. The current monitoring ranges and versatility of these circuit arrangements are often limited by the circuit components provided. For example, the range provided in the patent to Brooks is limited by the characteristics of the field effect diode employed.

In addition, an inexpensive, reliable, monitoring circuit is desired with the capability of indicating the continuity of DC current in a circuit without the necessity of reorganizing the circuit components. Many of the prior art devices require rearrangement of their corresponding components for this purpose, or the addition of new components which escalates the expense of employing such units.

The problem of circuit monitoring becomes even more acute when it is desired to test the operation of a switch in series with an energized load whose operation cannot be interrupted. No simple, inexpensive, reliable, on-line circuit arrangement appears to be presently available for this purpose. Accordingly, a new current monitor is desired having the versatility of satisfying the aforedescribed characteristics.

SUMMARY OF THE INVENTION

Briefly, this invention provides a means of visually monitoring the presence of current flow in a circuit over a current range of several orders of magnitude. Reliability and simplicity is achieved by employing a parallel arrangement of a zener diode and visual indicator in series with a load. The circuit is expanded to monitor the continuity in current flow in two separate parallel paths, feeding a common load in order to check the continuity of the circuitry and associated switching devices. The monitoring capability of the circuit is enhanced by enabling switching operations to be tested without deenergizing the load. Alternate polarity configurations of parallel zener diode arrangements are contemplated to expand the versatility of the operating modes of the circuitry of this invention.

BRIEF DESCRIPTION OF THE DRAWING

For a better understanding of the invention, reference may be had to the preferred embodiment, exemplary of the invention, shown in the accompanying drawings, in which.

DESCRIPTION OF THE PREFERRED EMBODIMENT

This invention provides a means for visually monitoring the presence of current flow in a circuit, over a current range of several orders of magnitude, which exhibits the desired characteristics previously set forth. In addition, this invention can be expanded, as described in following illustrative embodiments, to monitor the continuity and current flow in two separate parallel paths feeding a common load in order to check the continuity of current through the load and associated switching devices.

Figure 1:
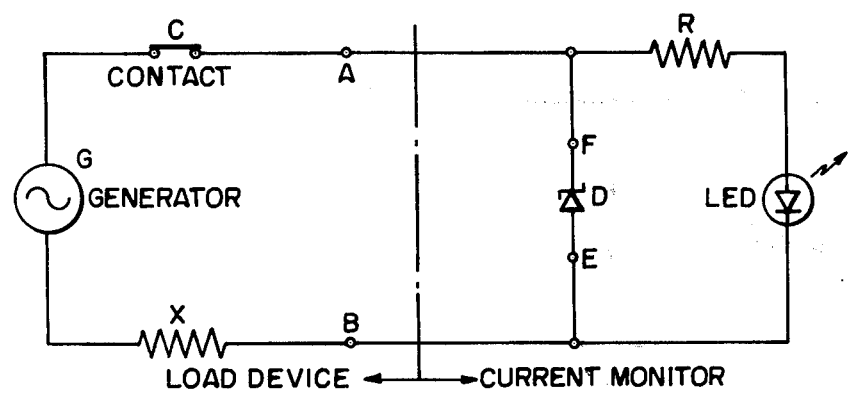
FIG. 1 is a schematic circuitry diagram illustrating the general arrangement of the current monitor contemplated by this invention.

A basic circuit arrangement incorporating the novel concept of this invention is illustrated in FIG. 1. Current from the power source G is communicated through a contact C to a point A coupling the monitoring circuit of this invention. The current emerges from the monitoring circuit at point B and is communicated through the load device X to the generator G to complete the circuit. Thus, the monitoring circuit is positioned external to and in series with the load circuit in which the current flow is monitored. The monitoring circuit illustrated basically comprises a zener diode D in parallel with a light emitting diode LED and current limiting resistor R.

The operation of the circuit thus illustrated can be understood from the following description. Assuming that an AC source of current supply is provided by the generator G and the breakdown voltage of the zener diode is chosen appropriately, then during the positive half cycle of the AC current waveform, current will flow from point A to point B producing a fixed voltage across the zener diode D substantially equal to its breakdown voltage. This voltage is applied across the light emitting diode LED and the current limiting resistor R to produce a visual indication of current flow in the load X. During the negative half cycle of the AC current waveform, current will flow from point B to point A causing the zener diode to conduct as a normal diode producing a negligible voltage drop of approximately 1 volt. This voltage will appear across the light emitting diode in the reverse direction with the result that no light will be produced.

In a typical application a zener diode having a breakdown voltage of five volts and a capacity of 50 watts; a resistor of approximately 50 ohms; and a light emitting diode with a forward voltage drop of 1.6 volts, reverse breakdown voltage of 3 volts minimum, and a power dissipation of approximately 100 milliwatts at 25°C can be employed. These parameters will yield a circuit capable of monitoring current in a range of 50 milliamperes to approximately 10 amperes. Of course, other ranges can be obtained with the proper selection of components. Additionally, it should be noted that an incandescent lamp can be substituted for the light emitting diode in the circuit shown, depending upon the range of currents to be monitored. The usage of the light emitting diode provides a definite advantage, in terms of light, low power consumption and definitive on-off indication.

In some applications it is necessary to test the operation of a contact feeding a load that cannot be deenergized except under emergency conditions. The current monitoring circuits illustrated in FIGS. 2, 3 and 4 can can be utilized to accomplish this test as described in the the following description.

Figure 2:
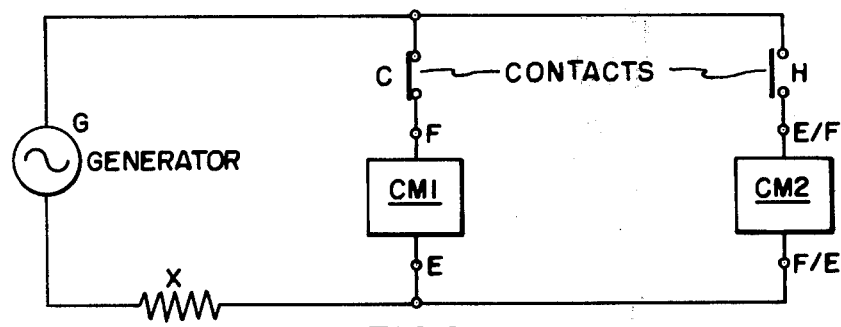
FIGS. 2, 3 and 4 are schematic circuitry diagrams illustrating novel arrangements of two of the current monitoring circuits illustrated in FIG. 1.
Figure 3:
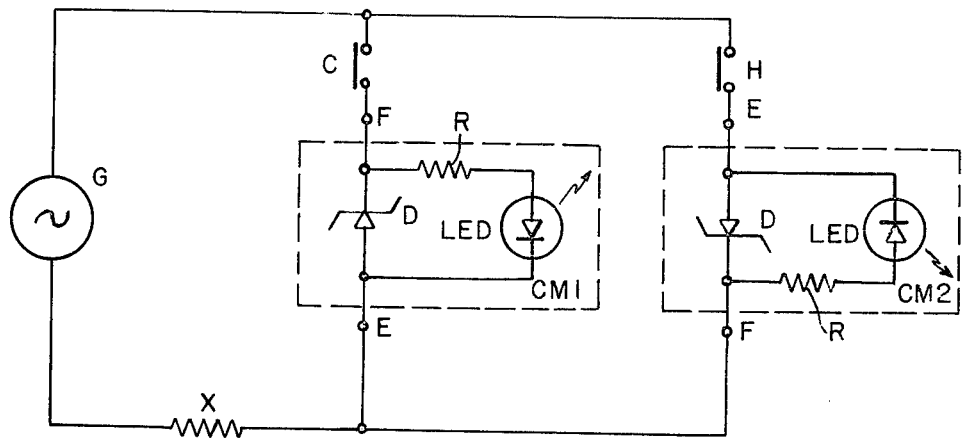
Figure 4:
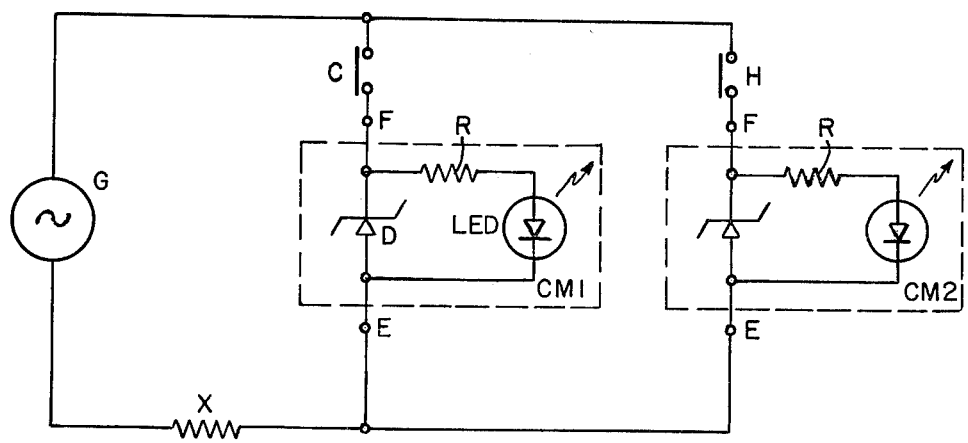

The embodiments illustrated in FIGS. 2, 3 and 4 is merely an extension of the circuit previously provided in FIG. 1. The current monitor illustrated in FIG. 1 is shown in block form by reference character CM1 and the circuits shown in FIGS. 3 and 4 are extended to include a series arrangement of a second contact H and a second current monitor CM2 in parallel with the current monitor and contact just described as shown in FIG. 2. In the first illustrative embodiment (FIG. 3) to be considered, the zener diode provided in the second current monitor CM2 is positioned to pass current in the reverse direction to that of the zener diode provided in the current monitor CM1. The light emitting diode associated with each current monitor is arranged to correspond to the circuit illustrated in FIG. 1. Accordingly, normal operation exists with contact C closed and contact H open. Current flows from the source generator G through contact C, current monitor CM1, load device X, and returns to generator G to complete the circuit. To test contact C, contact H is closed and current flow through contact H and current monitor CM2 maintains load X in an energized condition and permits contact C to be opened for test. With contact C closed and contact H open, current monitor CM1 will indicate current flow through contact C as described earlier.

Closing contact H places current monitor CM2 in shunt with current monitor CM1. Since the diodes in CM2 are connected in corresponding reverse polarity to the diodes in CM1, the zener diode in CM2, acting in its forward conducting state, will limit the voltage drop across the light emitting diode in CM1 to approximately 1 volt. This voltage is below the forward conduction voltage of the light emitting diode (1.6 volts in this embodiment) and no light will be produced. Conversely, the zener diode in CM1 limits the voltage across the light emitting diode in CM2, and no light will be produced. When contact C is open for test, the zener diode in CM2 will no longer be shunted by the diode in CM1, and the light emitting diode in CM2 will produce light to indicate the operation of contact C. Therefore, the operation of contact C can be tested without deenergization of the load device X, provided contacts C and H are not opened at the same time. Accordingly, the truth table for the circuit's operation will be as follows:

| C | H | CM1 | CM2 |
|---|---|-----|-----|
| 1 | 0 | 1   | 0   |
| 0 | 1 | 0   | 1   |
| 1 | 1 | 0   | 0   |
| 0 | 0 | 0   | 0   |

The exemplary circuit described can be modified to provide the following alternate truth table by positioning CM1 and CM2 in the circuit so that the zener diodes and light emitting diodes conduct in the same direction as shown in FIG. 4:

| C | H | CM1 | CM2 |
|---|---|-----|-----|
| 1 | 0 | 1   | 0   |
| 0 | 1 | 0   | 1   |
| 1 | 1 | 1   | 1   |
| 0 | 0 | 0   | 0   |

Note that by incorporating this modification and closing contacts C and H, both the light emitting diodes in CM1 and CM2 will produce light, as compared to the previous arrangement where both light emitting diodes are extinguished under the same conditions. Thus, this arrangement, incorporating a common connection of like polarities of the diodes, can be utilized for monitoring the current in DC circuits to indicate current flow, and in addition, can be used in a DC circuit to indicate the direction of the current flow. Reverse current in the circuit will reverse the polarity of the voltage applied to the light emitting diodes, and no light will be produced.

Thus, this invention provides an inexpensive, reliable, circuit arrangement that can be employed for monitoring both AC and DC currents over a wide range of operating parameters. In addition, the circuit arrangement contemplated by this invention can be employed to test contacts used in series with energized loads that cannot be deenergized because of their operating functions.

I claim as my invention:

1. A current monitoring circuit for monitoring the continuity of current through a load device comprising:
   a zener diode in series with the load; and
   means in parallel with the zener diode for indicating the presence of a reverse bias voltage across said zener diode which is greater or equal to the minimum voltage across said means when said means is conducting current, the minimum voltage across the means being less than the breakdown voltage of said zener diode.

2. The current monitor of claim 1 wherein said voltage indicating means comprises a light emitting diode having a forward diode voltage drop less than the breakdown voltage of said zener diode, in parallel with said zener diode, said light emitting diode being responsive to the reverse bias voltage across said zener greater or equal to the forward diode drop across said light emitting diode to provide a visual indication thereof.

3. The current monitor of claim 2 wherein the reverse breakdown voltage of said light emitting diode is greater than the voltage drop across said zener in the forward bias direction.

4. The current monitor of claim 1 for monitoring the direct current through a load wherein said zener diode is positioned to block the flow of current until raised to the breakdown voltage.

5. The current monitor of claim 1 for monitoring the current associated with the operation of a normally closed contact in series with the load without deenergizing the load including:
   a circuit breaking switch in parallel with the series connection of the contact and said zener diode and in series with the load;
   a second zener diode in parallel with the series connection of the contact and said zener diode and in series with the load and said switch; and
   means in parallel with said second zener diode for indicating the existence of the zener breakdown voltage across said second zener diode.

6. The current monitor of claim 5 wherein said second zener diode is positioned to normally pass current in the reverse direction to that of said zener diode in series with the contact.

7. The current monitor of claim 5 wherein said second zener diode is positioned to normally pass current in the same direction as said zener diode in series with the contact.

* * * * *